United States Patent [19]

Dennison

[11] Patent Number: 5,100,826
[45] Date of Patent: Mar. 31, 1992

[54] PROCESS FOR MANUFACTURING ULTRA-DENSE DYNAMIC RANDOM ACCESS MEMORIES USING PARTIALLY-DISPOSABLE DIELECTRIC FILLER STRIPS BETWEEN WORDLINES

[75] Inventor: Charles H. Dennison, Boise, Id.

[73] Assignee: Micron Technology, Inc., Boise, Id.

[21] Appl. No.: 695,182

[22] Filed: May 3, 1991

[51] Int. Cl.$^5$ ............................................. H01L 21/70
[52] U.S. Cl. ......................................... 437/52; 437/47; 437/48; 437/60; 437/228; 437/235; 437/919
[58] Field of Search ........................ 437/47, 48, 51, 52, 437/60, 191, 193, 195, 228, 233, 235, 919; 357/23.6, 51

[56] References Cited

U.S. PATENT DOCUMENTS

| | | | |
|---|---|---|---|
| 4,775,550 | 10/1988 | Chu et al. | 437/228 |
| 4,879,257 | 11/1989 | Patrick | 437/228 |
| 4,894,351 | 1/1990 | Batty | 437/228 |
| 4,953,126 | 8/1990 | Ema | 357/23.6 |

FOREIGN PATENT DOCUMENTS

| | | | |
|---|---|---|---|
| 0217644 | 10/1985 | Japan . | |
| 0210646 | 9/1987 | Japan . | |
| 0000142 | 1/1988 | Japan . | |
| 0302537 | 12/1988 | Japan | 437/228 |

OTHER PUBLICATIONS

Kimura et al., "A New Stocked Capacitor DRAM Cell Characterized by a Storage Capacitor on Bitline Structure" IEDM 88 pp. 596-599.

*Primary Examiner*—Tom Thomas
*Attorney, Agent, or Firm*—Angus C. Fox, III

[57] ABSTRACT

The process for creating multi-megabit DRAM memories comprises the following sequence of steps, which commence following an anisotropic etch of a first layer of type-1 insulative material (e.g. silicon dioxide), which creates wordline sidewall spacers: CVD deposition of a gap-filling layer of a type-2 insulative material (e.g. silicon nitride) having a high rate of etch selectively with respect to type-1 insulative material to a thickness sufficient to completely fill the gaps between wordlines; planarization of the gap-filling layer; removal of gap-filling insulative material in wordline gaps where bitline contact will be made; anisotropic removal of type-1 insulative material at the base of the bitline contact vias formed in the previous step; CVD deposition of a bitline polysilicon layer of sufficient thickness to completely fill the bitline contact vias; silicidation of the bitline polysilicon layer; deposition of a second layer of type-1 insulative material; patterning of the type-1 insulative-material-coated, silicided bitline polysilicon layer to form bitlines; blanket deposition of a third type-1 insulative layer; anisotropic etching of the third type-1 insulative layer in order to form bitline sidewall spacers; removal of gap-filling insulative material in storage-node plate contact regions; deposition of a storage-node polysilicon layer; and patterning of the storage-node poly layer.

10 Claims, 15 Drawing Sheets

5,100,826

PROCESS FOR MANUFACTURING ULTRA-DENSE DYNAMIC RANDOM ACCESS MEMORIES USING PARTIALLY-DISPOSABLE DIELECTRIC FILLER STRIPS BETWEEN WORDLINES

FIELD OF THE INVENTION

This invention relates to semiconductor manufacturing technology and, more specifically, to techniques for minimizing the spacing between word lines required to create buried contacts in dynamic random access memories of stacked-cell design.

BACKGROUND OF THE INVENTION

The memory cells of dynamic random access memories are comprised of two main components: a field-effect transistor and a capacitor. In DRAM cells utilizing a conventional planar capacitor, far more chip surface area is dedicated to the planar capacitor than to the field-effect transistor (FET). Wordlines are generally etched from a polysilicon-1 layer. A doped region of silicon substrate functions as the lower (storage-node) capacitor plate, while a polysilicon-2 generally functions as the upper capacitor plate (cell plate). Although planar capacitors have generally proven adequate for use in DRAM chips up to the one-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense-amp differential signal is reduced. This aggravates noise sensitivity and makes it more difficult to design a sense-amp having appropriate signal selectivity. Thirdly, as cell capacitor size is decreased, the cell refresh time must generally be shortened, thus requiring more frequent interruptions for refresh overhead. The difficult goal of a DRAM designer is therefore to increase or, at least, maintain cell capacitance as cell size shrinks, without resorting to processes that reduce product yield or that markedly increase the number of masking and deposition steps in the production process.

All manufacturers of 4-megabit DRAMs are utilizing cell designs based on non-planar capacitors. Two basic non-planar capacitor designs are currently in use: the trench capacitor, and the stacked capacitor. Both types of non-planar capacitors typically require a considerably greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digitline beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

There are at least four, performance-degrading design problems associated with the fabrication of stacked-cell DRAM memories that may be ameliorated by implementing the new DRAM manufacturing process disclosed herein. The first is that of excessive bit line resistance which results in low-speed devices. The second problem is that of excessive bit line capacitance that leads to a reduced bit line sense amp signal. The third problem is that of greater-than-optimum cell width due to the need to provide sufficient overlap between bit line mask and bit line contact mask to prevent unwanted substrate trenching within mask alignment tolerances. The fourth problem is that of spacer build-up in storage-node buried contact regions, brought about by the need to insulate not only the upper surfaces, but also the edges of bit lines.

Excessive bit line resistance arises in a conventional stacked cell DRAM memory as the result of the vertical topography. Typically, buried bit lines are formed from conformal polysilicon layers deposited via chemical vapor deposition (CVD). The layers are then silicided and patterned. Since the silicide layer, which carries the majority of the bitline current follows the topography (i.e. by ascending and descending extant word lines), resistance of such non-planar bit lines is increased (compared to those of the planar variety) due to both the poor quality of silicidation on vertical bit line segments and the added length thereof created by the non-planarity.

Excessive bit line capacitance is arises from the proximity of a bit line to the various word lines it traverses. Capacitance is added by the proximity of vertical bit line segments to word line edges. This capacitive component can be largely eliminated with planar bit lines.

Greater-than-optimum cell width, attributable to the necessity of providing sufficient overlap between bit line mask and bit line contact mask to prevent unwanted substrate trenching within mask alignment tolerances, could be eliminated if it were not necessary to etch certain portions of the bitline layer down to the substrate level.

Spacer build-up in storage-node buried contact regions of a stacked-cell DRAM memory is a result of the need to make contact with the substrate between certain word line pairs for both bit line and storage node plate contact. Although the use of a buried, silicided polysilicon bit line reduces step coverage problems that would be associated with the deep bit line vias that would otherwise be required for surface-deposited metal bit lines in a stacked-cell DRAM memory, buried bit lines are typically adjacent the capacitor plates of the finished cell. Hence, it is essential that the top and sides of each bitline be coated with an insulative material. Generally, the bit line process flow follows a sequence of depositing a bit line poly layer, siliciding the bit line poly layer, depositing a first oxide layer on top of the silicided poly layer, then patterning the resulting sandwich to form the bit lines. A second oxide layer is then blanket deposited and anisotropically etched to create spacers on the sides of the bit lines. Unfortunately, the oxide layer used to form the spacers on the sides of the bit lines fills the space between word lines where storage node plate contact is made to a substrate junction. For conventional process flows, the need for bit line side spacers mandates the spacing between the word lines pairs, where storage node plate contact is made, be sufficiently wide to accommodate this superfluous buildup of oxide spacer material.

By planarizing the polysilicon layer from which it patterns bit lines prior to silicidation, Hitachi Corporation has achieved low-resistance bit-line wiring for its 64 megabit DRAMs. The process is explained in a paper presented at the 1990 Symposium on VLSI Technology sponsored by the IEEE entitled "A 1.28 $\mu m^2$ Bit-Line Shielded Memory Cell Technology for 64MB DRAMs". The Hitachi process comprises the steps of depositing a thick polysilicon-2 layer through CVD, the poly-2 layer then being planarized in an etch-back step, silicided for resistance reduction, and finally patterned as bit lines. This Hitachi process, however, does not address the problems of excessive bit line capacitance, greater-than-optimum cell width, and spacer build-up in storage-node buried contact regions.

What is needed is a DRAM process flow that will ameliorate all four of the aforementioned problems with a minimum of additional processing steps.

SUMMARY OF THE INVENTION

This invention constitutes a process for creating a multi-megabit DRAM memory of the stacked-cell type having a series of parallel wordlines patterned from a sandwich of dielectric-covered, silicided polysilicon, said wordlines being overlaid by an intersecting series of parallel bitlines to create a waveform topology. Wordline gaps are filled with dielectric filler strips, which in buried contact regions, are disposable. In non-buried contact regions, the filler strips are left in place so as to reduce bit line capacitance. The process comprises the following sequence of steps, which commence following an anisotropic etch of a first layer of type-1 insulative material (e.g. silicon dioxide), which creates wordline sidewall spacers: CVD deposition of a gap-filling layer of a type-2 insulative material (e.g. silicon nitride) having a high rate of etch selectively with respect to type-1 insulative material to a thickness sufficient to completely fill the gaps between wordlines; planarization of the gap-filling layer; removal of gap-filling insulative material in wordline gaps where bitline contact will be made; anisotropic removal of type-1 insulative material at the base of the bitline contact vias formed in the previous step; CVD deposition of a bitline polysilicon layer of sufficient thickness to completely fill the bitline contact vias; silicidation of the bitline polysilicon layer; deposition of a second layer of type-1 insulative material; patterning of the type-1 insulative-material-coated, silicided bitline polysilicon layer to form bitlines; blanket deposition of a third type-1 insulative layer; anisotropic etching of the third type-1 insulative layer in order to form bitline sidewall spacers; removal of gap-filling insulative material in storage-node plate contact regions; deposition of a storage-node polysilicon layer; and patterning of the storage-node poly layer.

BRIEF DESCRIPTION OF THE DRAWINGS

In FIGS. 2 through 14, the array is depicted in cross-sectional format at various stages during the fabrication process. At any particular stage, one or more of four cross sectional views are shown. A letter after following a figure number (e.g., FIG. 6B) indicates that the drawings represents a cross-sectional view taken through the broken line identified by a pair of those letters (e.g., B—B).

PREFERRED EMBODIMENT OF THE INVENTION

Figure 1:
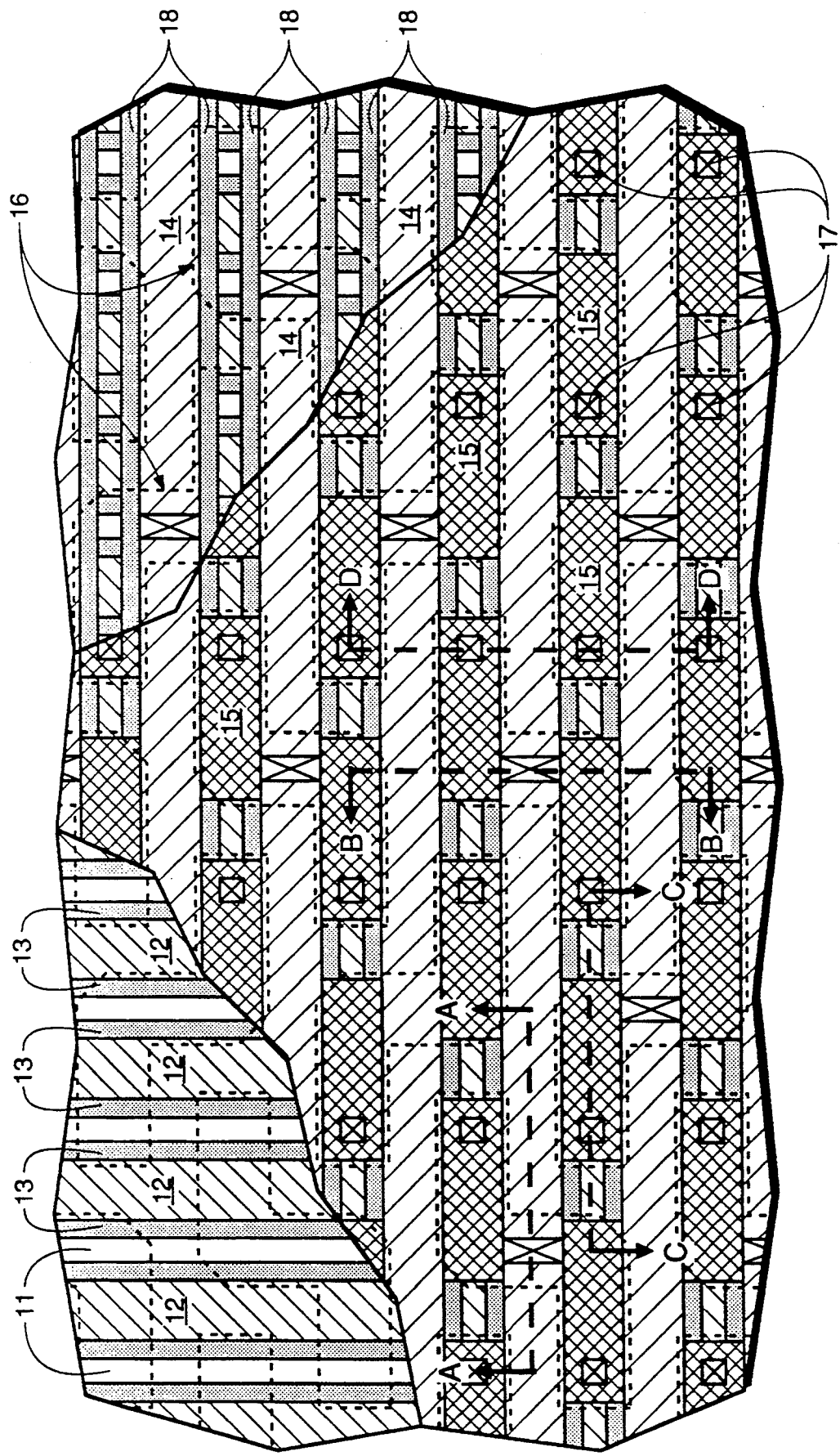
FIG. 1 is partially-cutaway, top plan layout of a completed stacked-cell DRAM array which incorporates the invention.

Referring now to FIG. 1, a completed conventional stacked-cell DRAM memory array fabricated on a monocrystalline silicon substrate 11 is depicted in a simplified, schematic layout format. The array is comprised of a series of parallel, polysilicon wordlines 12 silicided with tungsten, titanium, or other similar refractory metal, the tops of the wordlines being insulated by a first dielectric capping layer (not shown in this view), the sides of the wordlines being insulated by a first set of dielectric spacers 13; a series of bitlines 14, each of which, in the course of its run through the array, makes contact with a multiplicity of heavily doped substrate regions or "active areas" (the areas of bitline-to-substrate contact are rectangular in shape and marked with an "X"); and a multiplicity of storage-node capacitor plates (the rectangular regions marked by a diagonally-cross-hatched pattern) 15. Each active area (the square-S-shaped regions bounded by dashed lines) 16 is shared by a pair of cells. Each storage node plate 15 makes contact with its associated active area in a storage-node junction region 17, that is identified by a square marked with an "X". Each bitline is insulated by a second set of dielectric sidewall spacers 18 and a second dielectric capping layer (not shown in this view). Active areas 16 are separated by field oxide regions, which are not shown in this view. Although impossible to identify all essential physical elements of the array in the top plan view of FIG. 1, many more of those elements are readily apparent in the following cross-sectional views.

Figure 2A:
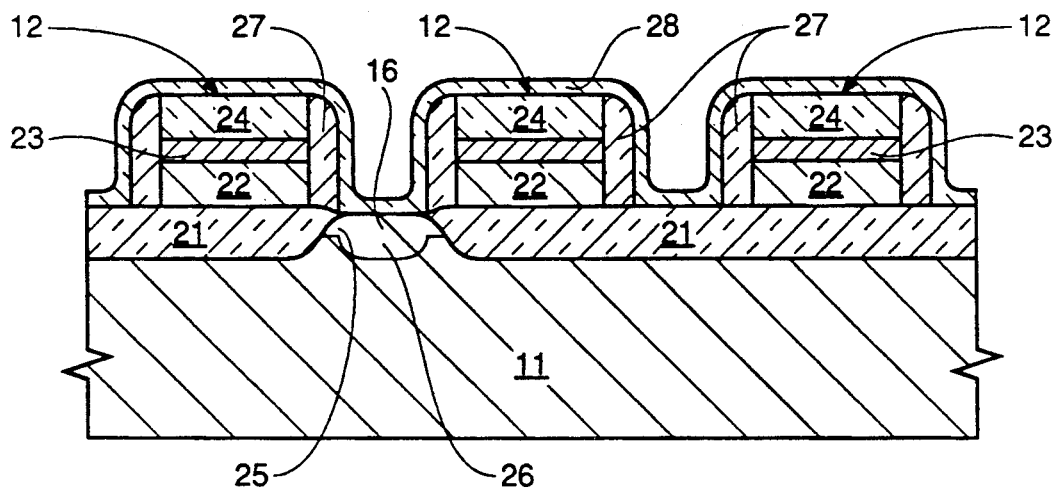
FIG. 2A is a cross-sectional view of a portion of the DRAM array of FIG. 1 at a manufacturing stage where active areas and fully-recessed field oxide regions have been created, wordlines have been patterned from a polysilicon-1 layer, lightly-doped junction regions have been created by implanting phosphorus, spacers have been created on wordline sidewalls by anisotropically etching a conformally-deposited silicon dioxide layer, heavily-doped junction regions have been created by implanting arsenic, and a substrate isolation layer has been conformally deposited.

Referring now to FIG. 2A, a cross-sectional view of a portion of the DRAM array of FIG. 1 through broken line A—A is depicted at a manufacturing stage where active areas 16 and fully-recessed field oxide regions 21 have been created, wordlines 12 have been patterned from a three layer sandwich consisting of a polysilicon-1 layer 22, a silicide layer 23, and a first capping oxide layer 24. Active areas 16 consist of lightly-doped junction regions 25, which have been created by implanting phosphorus, and heavily-doped junction regions 26, created by implanting arsenic following the creation of wordline sidewall spacers 27 which resulted from the deposition and anisotropic etch of a first spacer silicon dioxide layer. In addition, a substrate isolation layer 28 has been conformally deposited.

Figure 3A:
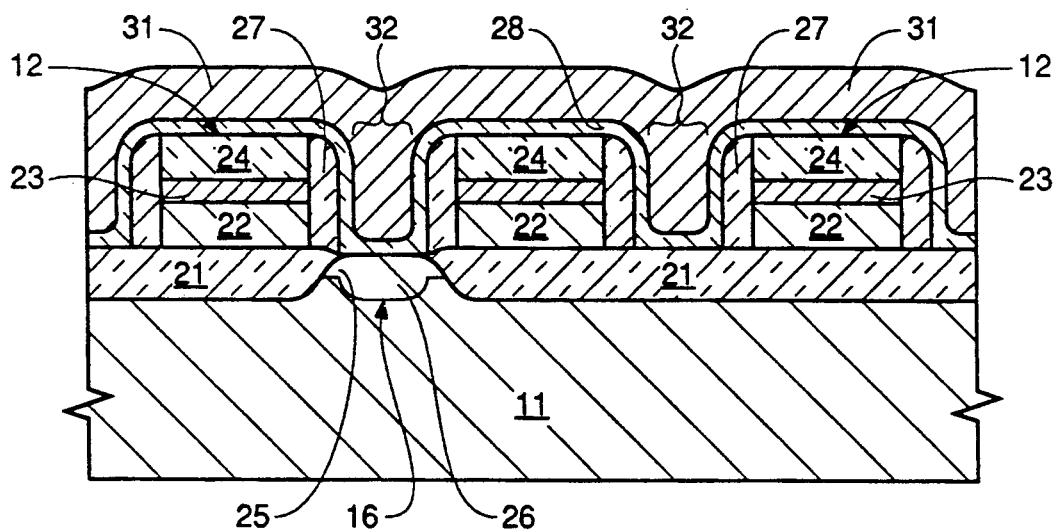
FIG. 3A is a view of the in-process DRAM array portion cross section of FIG. 2A following further processing, that includes CVD deposition of a silicon nitride layer which completely fills wordline gaps.

Referring now to FIG. 3A, the in-process memory array is shown following the deposition of a silicon nitride layer 31 via chemical vapor deposition (CVD), silicon nitride layer 31 being of sufficient thickness to completely fill wordline gaps 32.

Figure 4A:
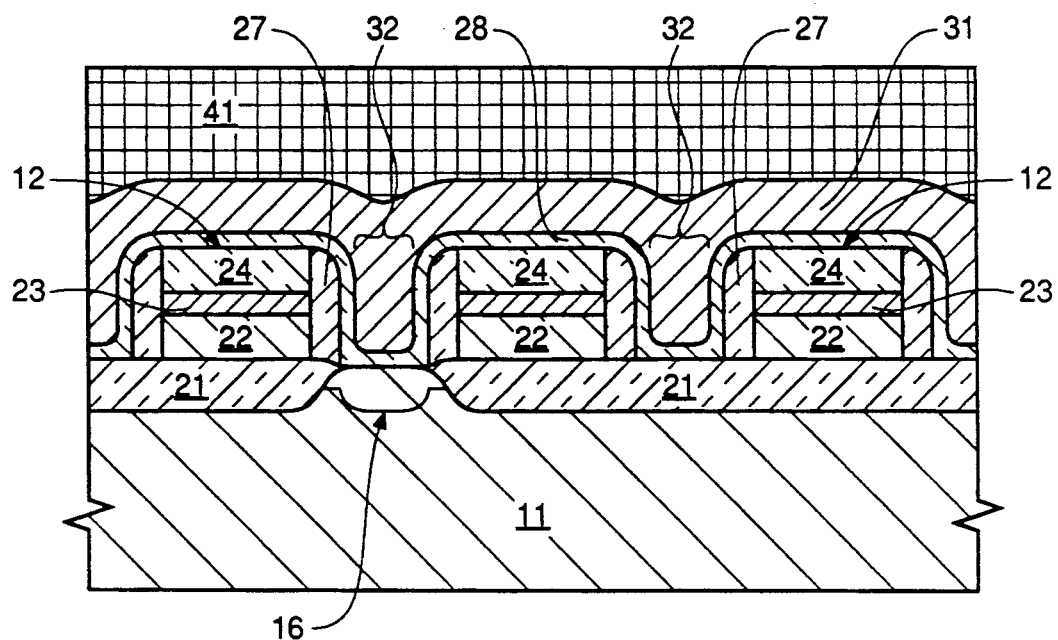
FIG. 4A is a view of the in-process DRAM array portion cross section of FIG. 3A following blanket coating with photoresist.

Referring now to FIG. 4A, the in-process array has received a blanket coating of photoresist 41.

Figure 5A:
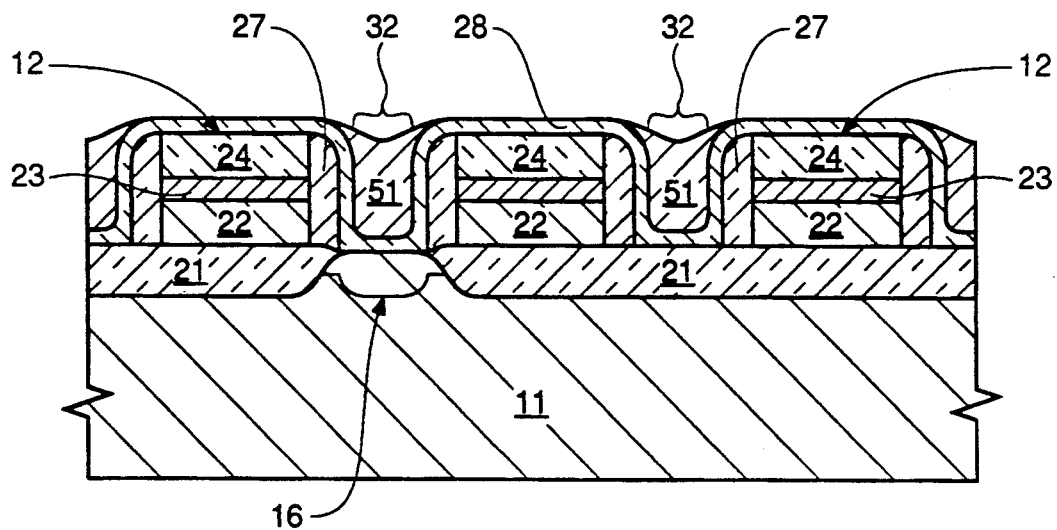
FIG. 5A is a view of the in-process DRAM array portion cross section of FIG. 4 following a planarizing etch which leaves silicon nitride filler strips between wordlines.

Referring now to FIG. 5A, the in-process array has been subjected to a planarizing etch, which leaves silicon nitride filer strips 51 between wordlines 16. It should be noted that planarization of the array may be accomplished by any one of a number of known techniques, such as simply utilizing planarizing etch, or spinning photoresist over the array in order to create a planarized surface, then plasma etching the array back to the desired level, or mechanically planarizing the array.

Figure 6A:
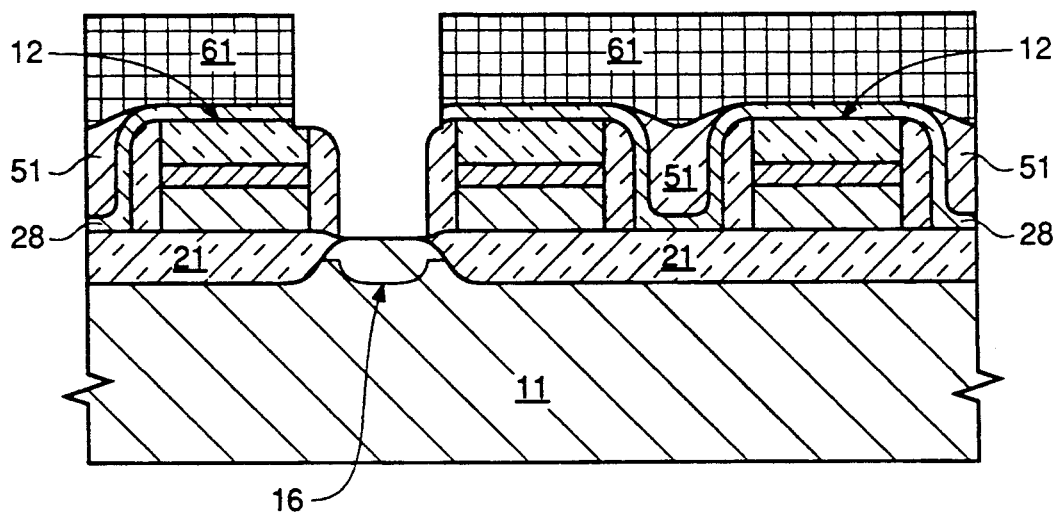
FIG. 6A is a view of the in-process DRAM array portion cross section of FIG. 5 following bitline contact photoresist masking and etching.

Referring now to FIG. 6A, the in-process array has been masked with a bitline contact photomask 61, and subjected to a plasma etch selective for nitride over oxide in order to remove the portion of nitride filler strip 51 that is exposed by bitline contact photomask 61. Currently, selectivity as great as 15:1 has been reported in the literature. In order to clear a portion of substrate isolation layer 28 from active area 16, additional plasma etching is utilized.

Figure 6B:
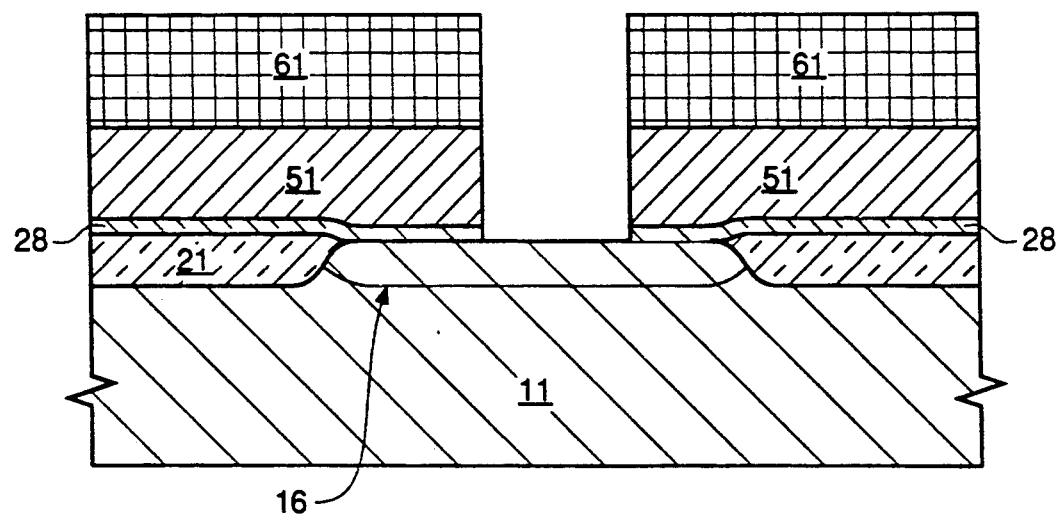
FIG. 6B is a different cross-sectional view of the in-process DRAM array, contemporaneous with FIG. 6A.

Referring now to FIG. 6B, a different cross-sectional view of the in-process DRAM array, taken parallel to and between a pair of wordlines. Visible in this view is substrate isolation layer 28, nitride filler strip 51, and bitline contact photomask 61.

Figure 7A:
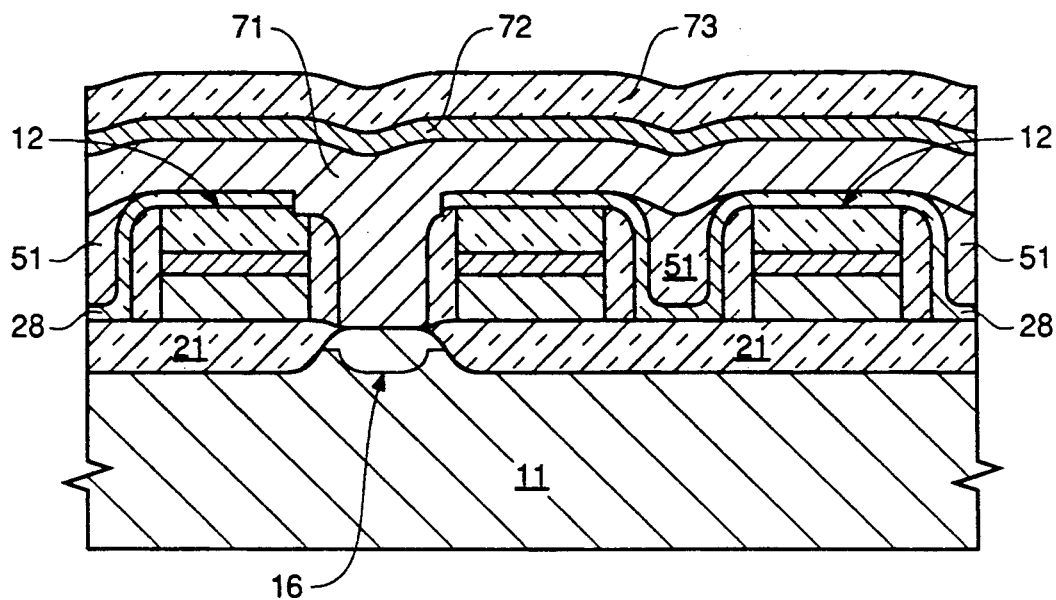
FIG. 7A is a view of the in-process DRAM array portion cross section of FIG. 6A following CVD deposition of a polysilicon-2 layer, silicidation of the polysilicon-2 layer, and blanket deposition of a silicon dioxide bitline capping layer.
Figure 7B:
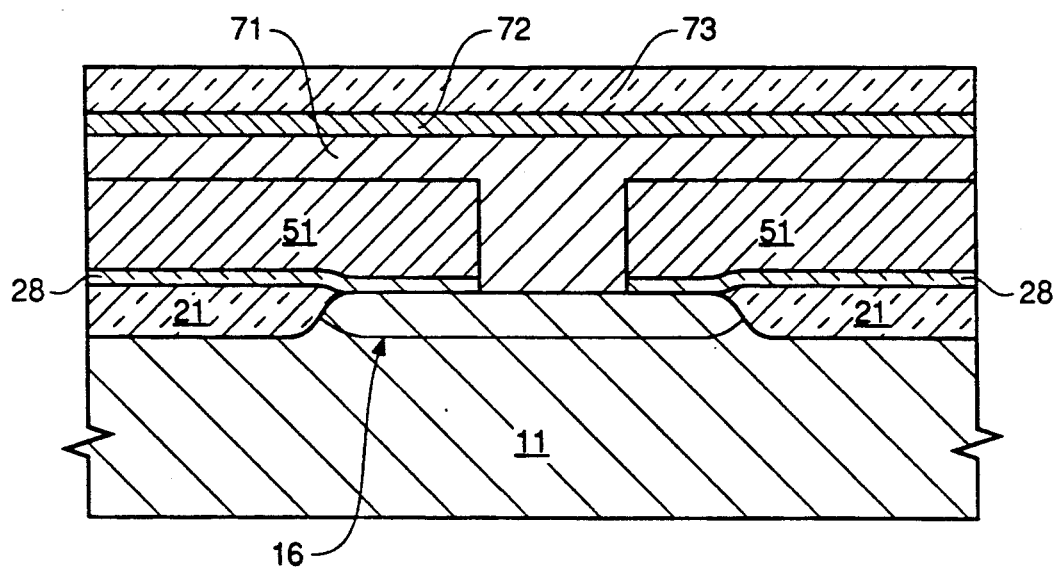
FIG. 7B is a different cross-sectional view of the in-process DRAM array, contemporaneous with FIG. 7A.

Referring now to FIG. 7A, the in-process array has been subjected to CVD deposition of a polysilicon-2 layer 71, blanket deposition of a metal silicide layer 72 on top of poly-2 layer 71, and blanket deposition of a silicon dioxide bitline capping layer 73 on top of silicide layer 72. FIG. 7B, a cross-sectional view perpendicular to the cross-sectional view of FIG. 7A shows the bit line contact region from a different perspective.

Figure 8A:
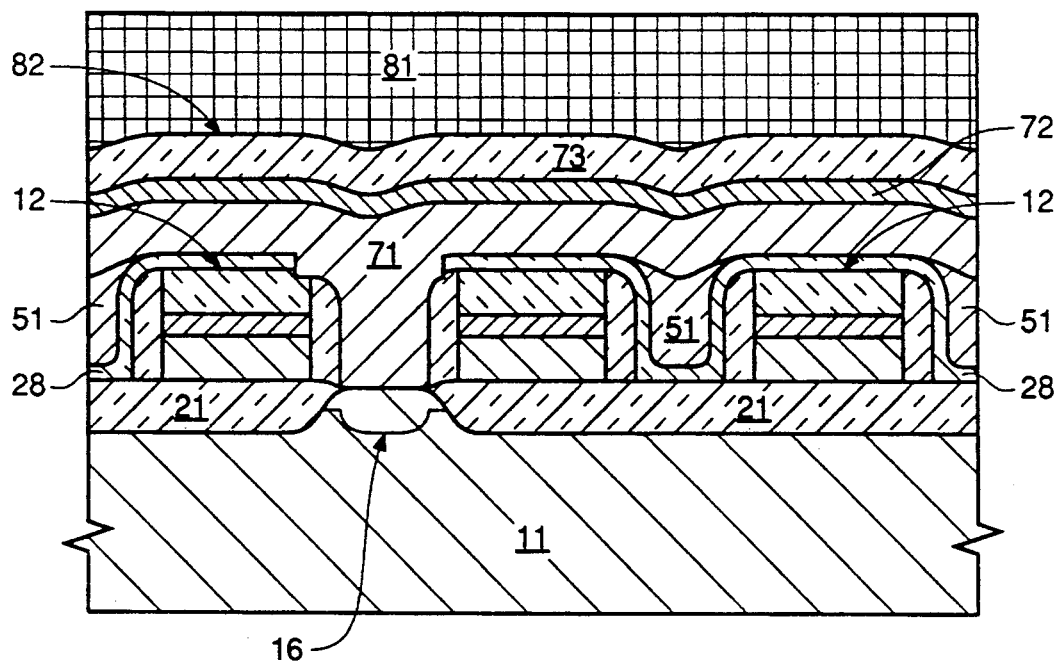
FIG. 8A is a view of the in-process DRAM array portion cross section of FIG. 7A following bitline patterning with photoresist, and etching.

Referring now to FIG. 8A, bitline patterning with bitline photomask 81, and etching to create the individual bitlines has not changed the array cross-section structure through broken line A—A from that of FIG. 7A.

Figure 8B:
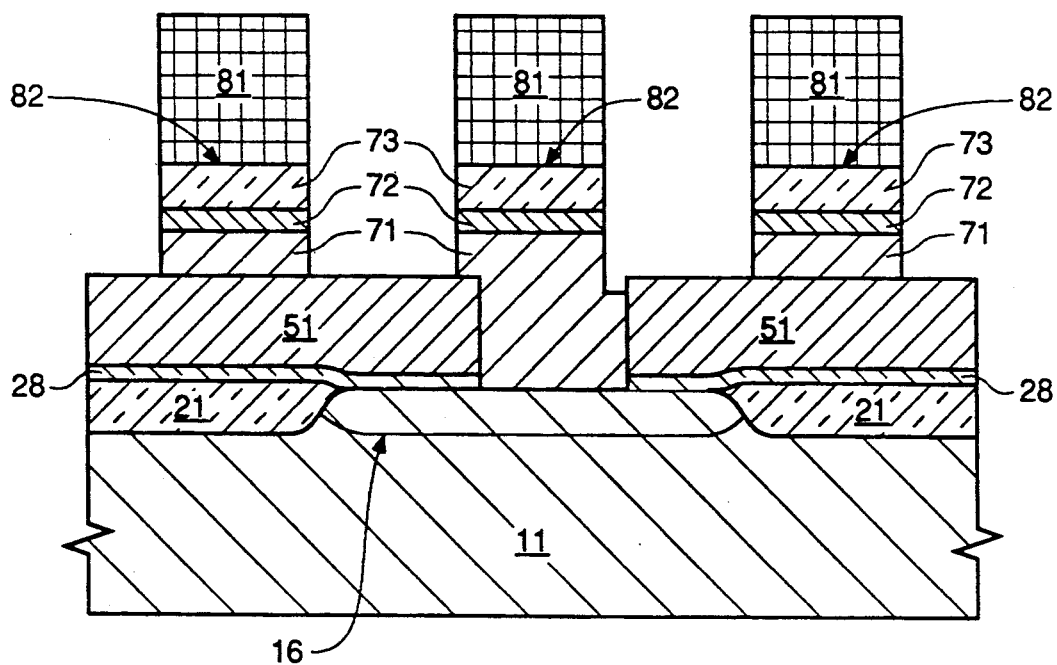
FIG. 8B is a different cross-sectional view of the in-process DRAM array, contemporaneous with FIG. 8A.
Figure 8C:
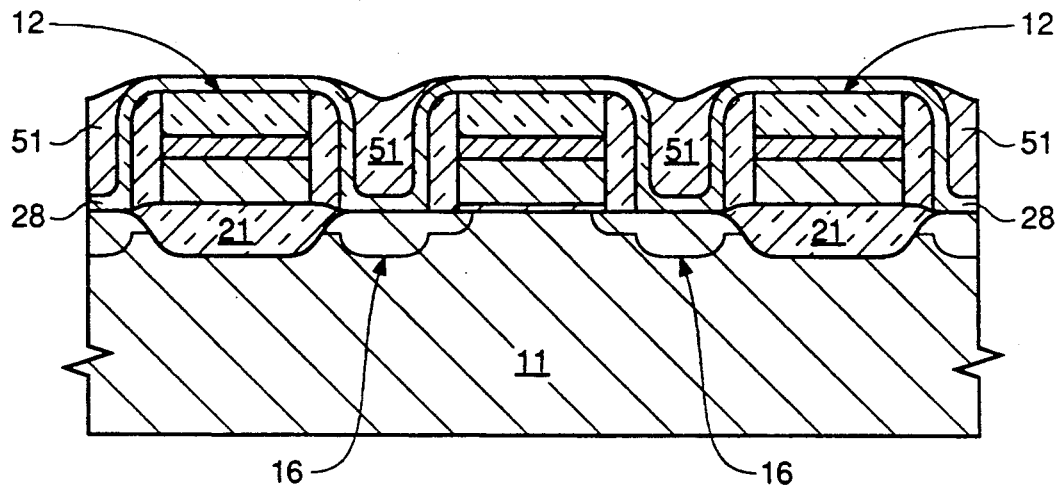
FIG. 8C is a different cross-sectional view of the in-process DRAM array, contemporaneous with FIG. 8A.
Figure 8D:
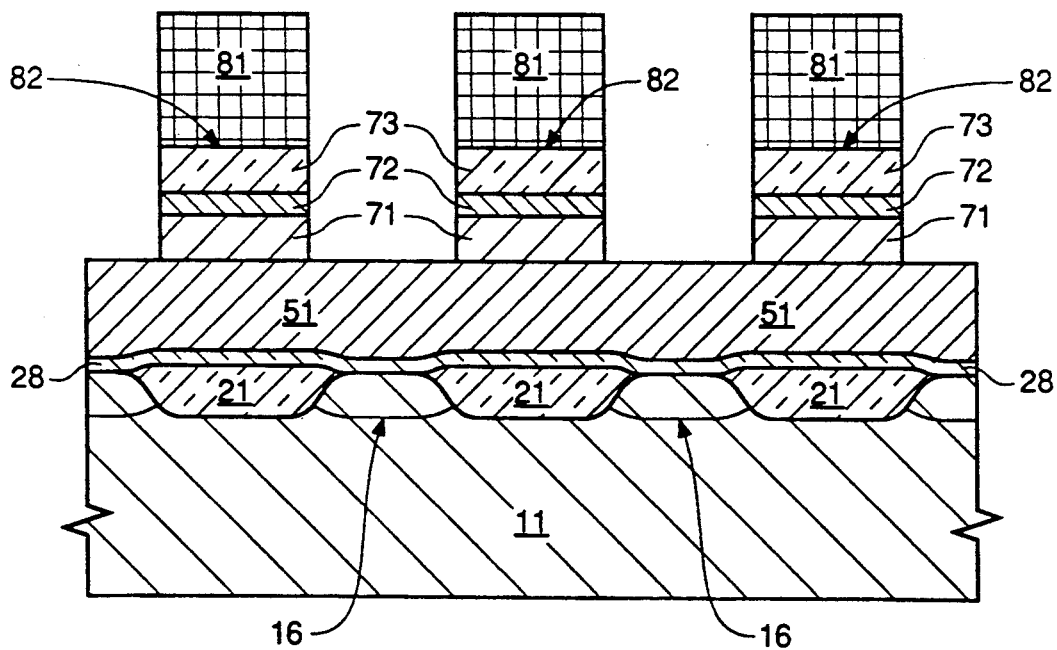
FIG. 8D is a different cross-sectional view of the in-process DRAM array, contemporaneous with FIG. 8A.

Referring now to FIG. 8B, the effect of the bitline etch is apparent in this cross-sectional view. Three individual bitline photomask blocks 81 are visible, as are each of the silicided, oxide-covered bitlines 82. FIGS. 8C and 8D depict different, but process contemporaneous perspectives of the array.

Figure 9A:
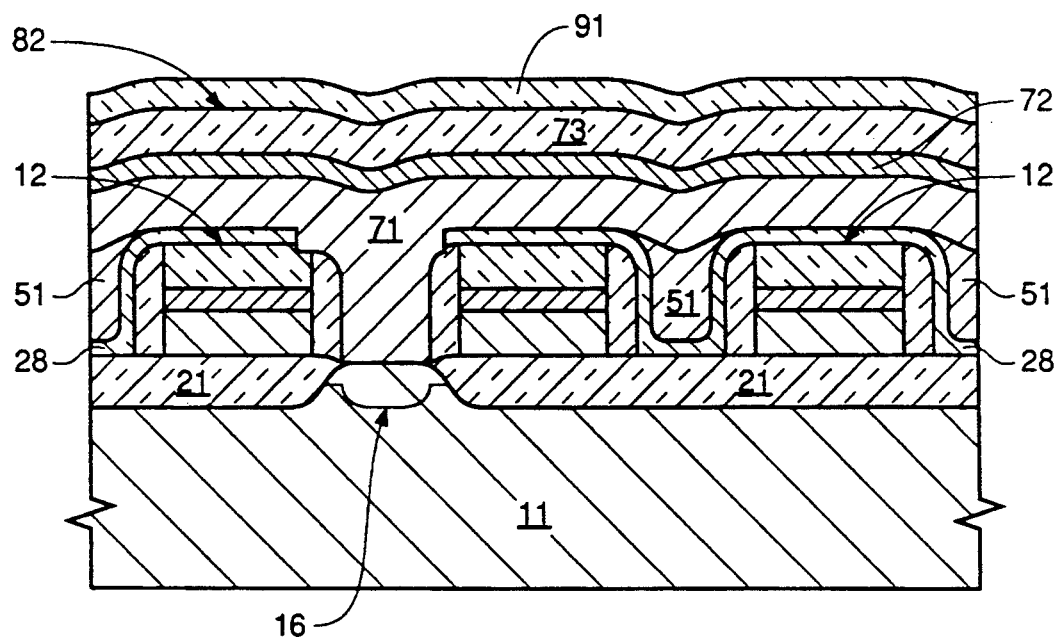
FIG. 9A is a view of the in-process DRAM array portion cross section of FIG. 8A following blanket deposition of a bitline spacer layer.
Figure 9B:
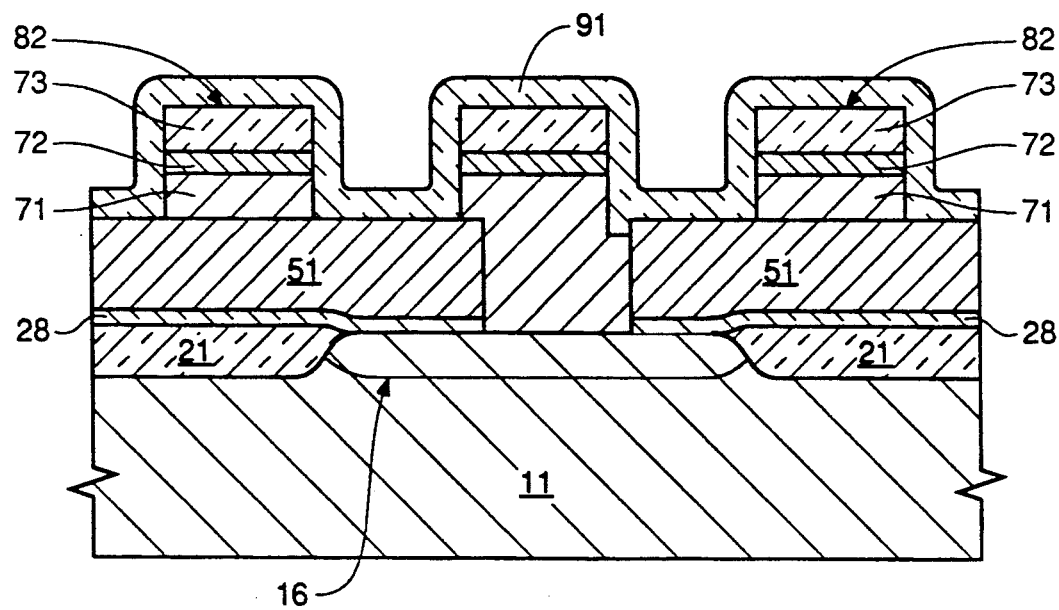
FIG. 9B is a different cross-sectional view of the in-process DRAM array, contemporaneous with FIG. 9A.
Figure 9C:
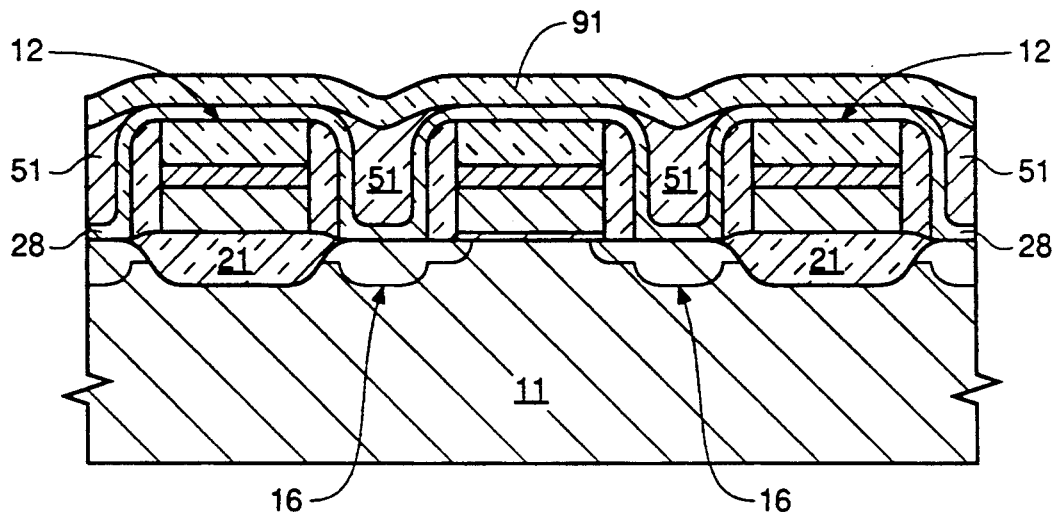
FIG. 9C is a different cross-sectional view of the in-process DRAM array, contemporaneous with FIG. 9A.
Figure 9D:
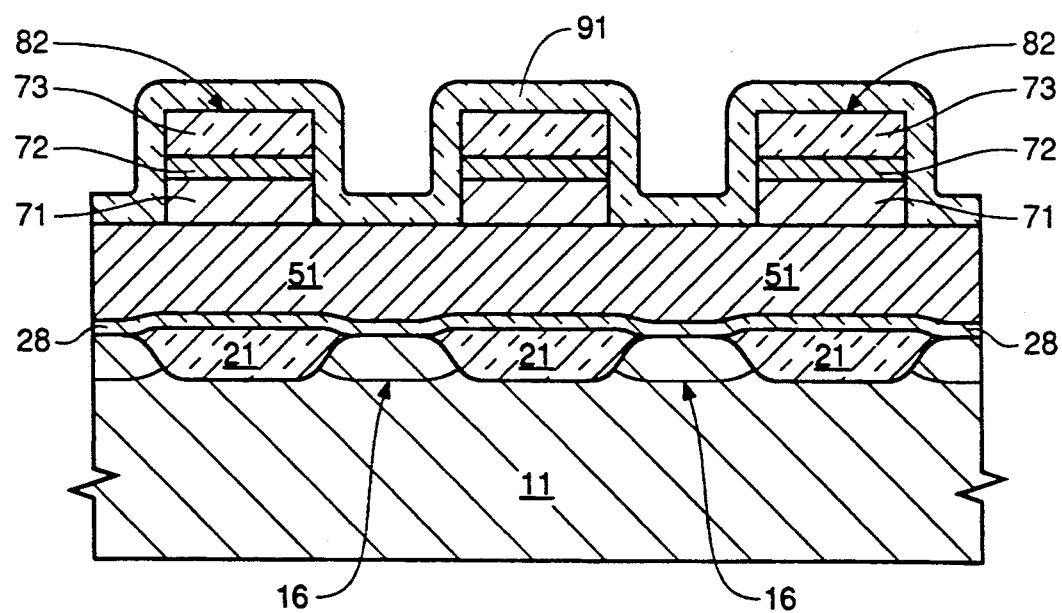
FIG. 9D is a different cross-sectional view of the in-process DRAM array, contemporaneous with FIG. 9A.

Referring now to FIG. 9A, the in-process array has been subjected to the deposition of a silicon dioxide bitline spacer layer 91. FIGS. 9B, 9C and 9D shows a contemporaneous, cross-sectional view through broken line B—B, C—C and D—D, respectively.

Figure 10A:
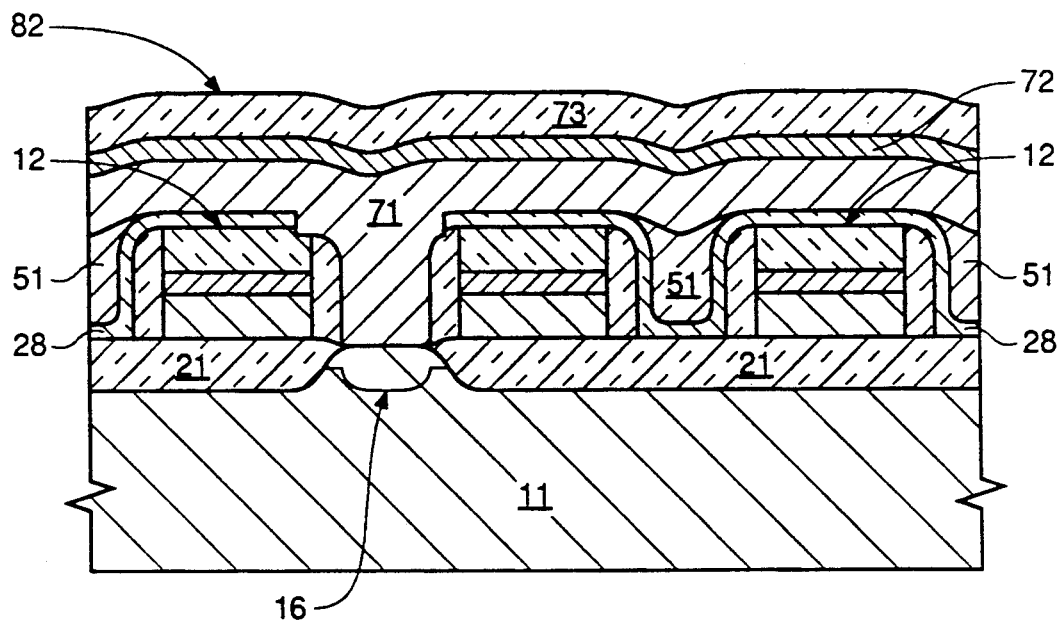
FIG. 10A is a view of the in-process DRAM array portion cross section of FIG. 9A following an anisotropic etch of the bitline spacer layer.
Figure 10B:
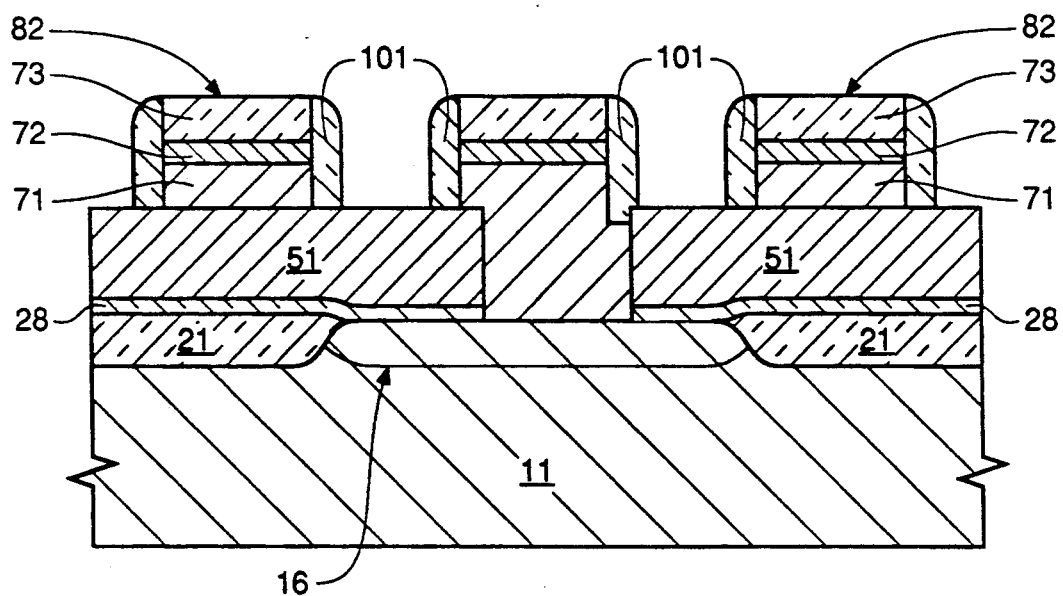
FIG. 10B is a different cross-sectional view of the in-process DRAM array, contemporaneous with FIG. 10A.

Referring now to FIG. 10A, the in-process array has been subjected to an anisotropic etch of bitline spacer layer 91, which has created bitline sidewall spacers 101 (not shown in this view). Bitline sidewall spacers 101 are visible in FIG. 10B.

Figure 11C:
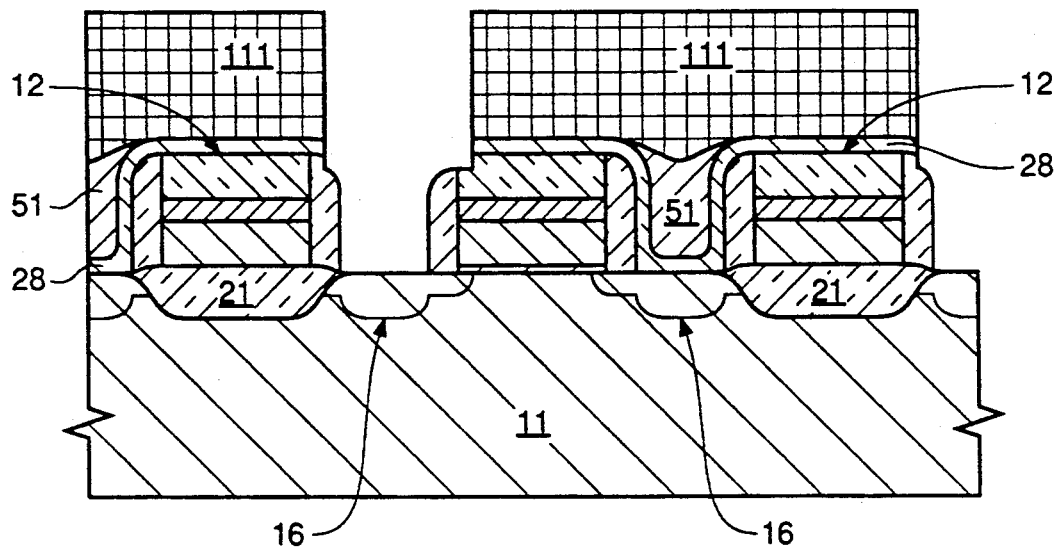
FIG. 11C is a view of the in-process DRAM array portion cross section of FIG. 10C following storage node contact patterning with photoresist and etching.
Figure 11D:
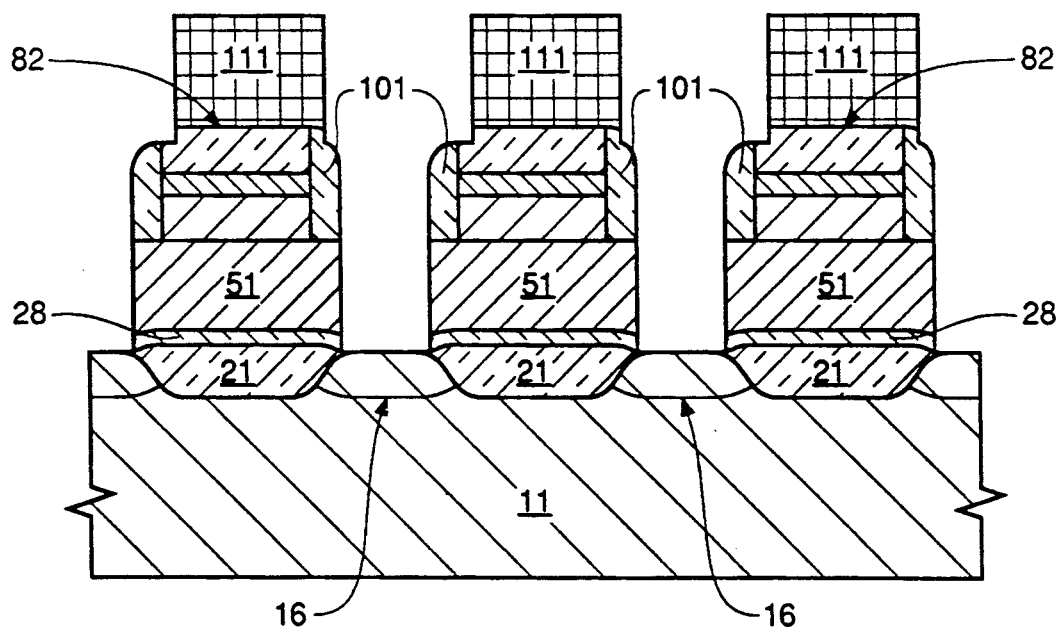
FIG. 11D is a different cross-sectional view of the in-process DRAM array, contemporaneous with FIG. 11C.

Referring now to FIG. 11C, the in-process array has been masked with storage node contact photomask 111. Subsequent to this masking step, the array is subjected to a plasma etch selective for silicon nitride over silicon dioxide. The portion of the substrate isolation layer 28 within the storage node contact region is removed with an anisotropic plasma etch selective for oxide. FIG. 11D gives a different view of this stage of the process.

Figure 12C:
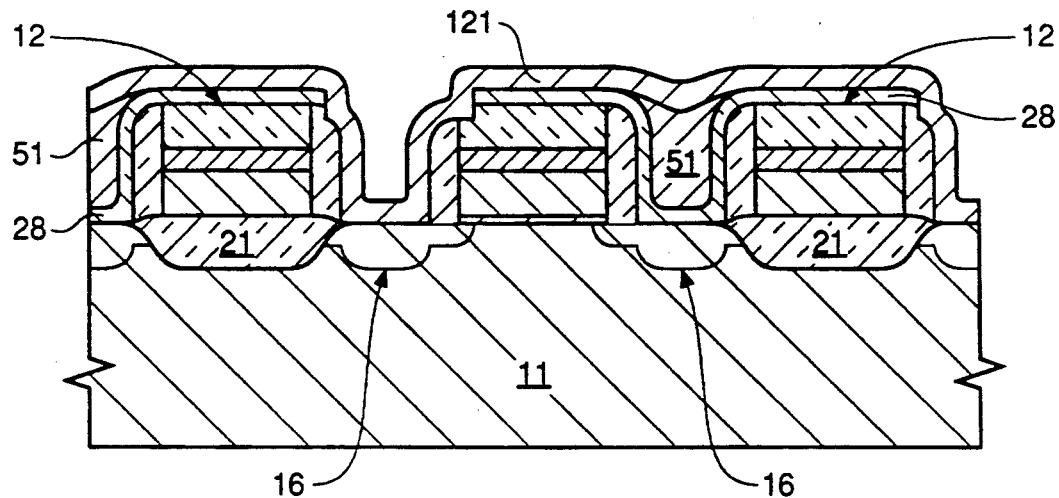
FIG. 12C is a view of the in-process DRAM array portion cross section of FIG. 11C following a photoresist strip, and deposition of a storage-node polysilicon-3 layer.
Figure 12D:
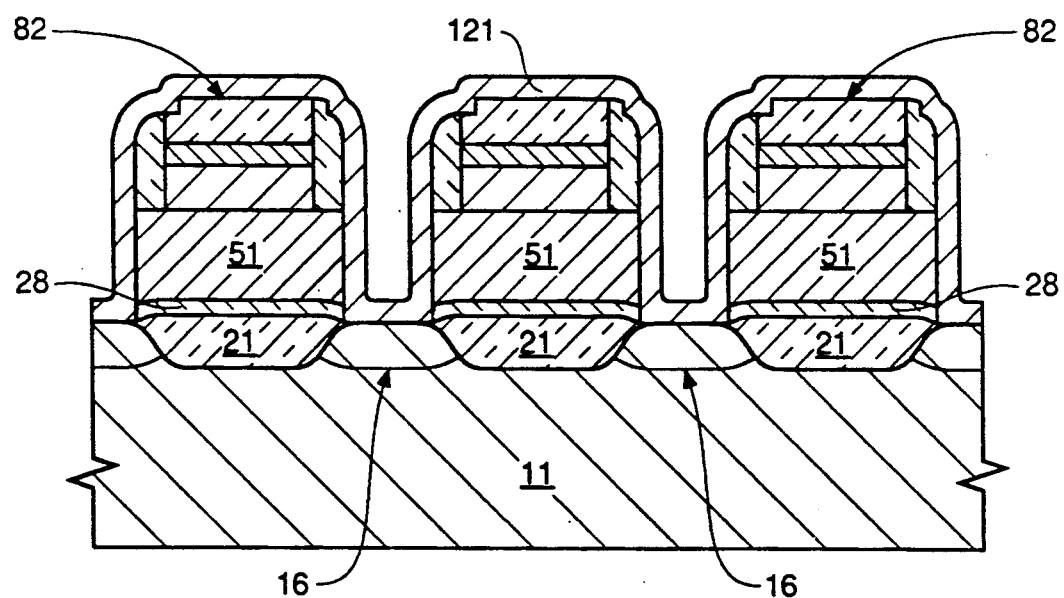
FIG. 12D is a different cross-sectional view of the in-process DRAM array, contemporaneous with FIG. 12C.

Referring now to FIG. 12C, storage-node contact photomask 111 ha been stripped from the in-process array, and a polysilicon-3 layer 121, from which will be patterned individual storage-node plates, has been blanket deposited. FIG. 12D gives a different, but contemporaneous perspective of the in-process array.

Figure 13C:
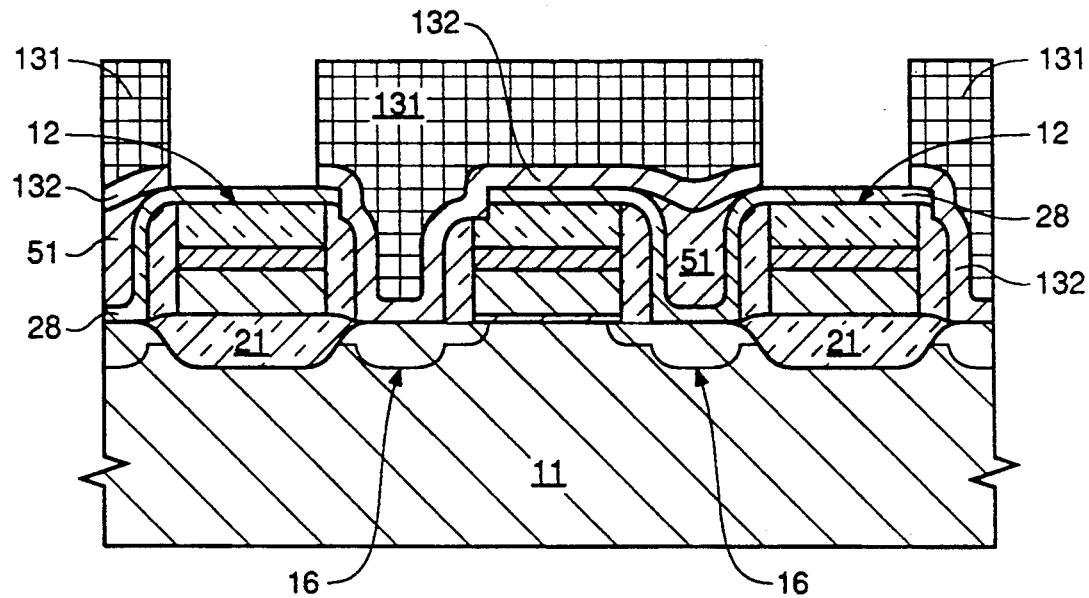
FIG. 13C is a view of the in-process DRAM array portion cross section of FIG. 12C following patterning of the polysilicon-3 layer with photoresist and etching the polysilicon-3 layer.
Figure 13D:
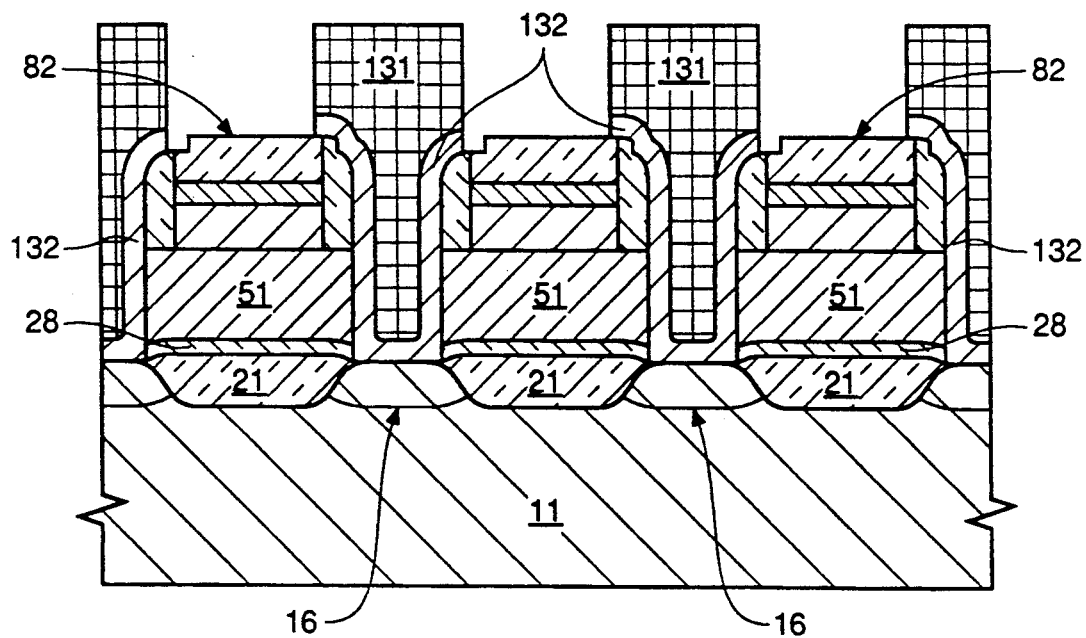
FIG. 13D is a different cross-sectional view of the in-process DRAM array, contemporaneous with FIG. 13C.

Referring now to FIG. 13C, polysilicon-3 layer 121 has been patterned with storage node photomask 131 and etched to form individual storage-node capacitor plates 132. FIG. 13D provides a different, but contemporaneous perspective of the array.

Figure 14A:
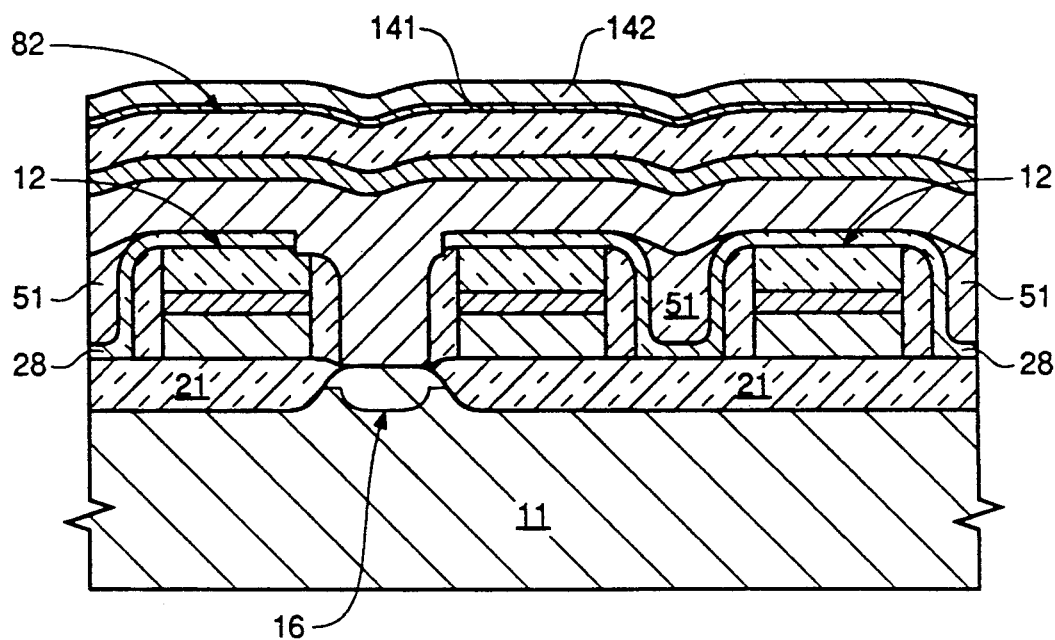
FIG. 14A is a view of the in-process DRAM array a portion of which was depicted in FIGS. 13C and 13D, following a photoresist strip, cell dielectric deposition, and deposition of a cell plate polysilicon-4 layer.
Figure 14B:
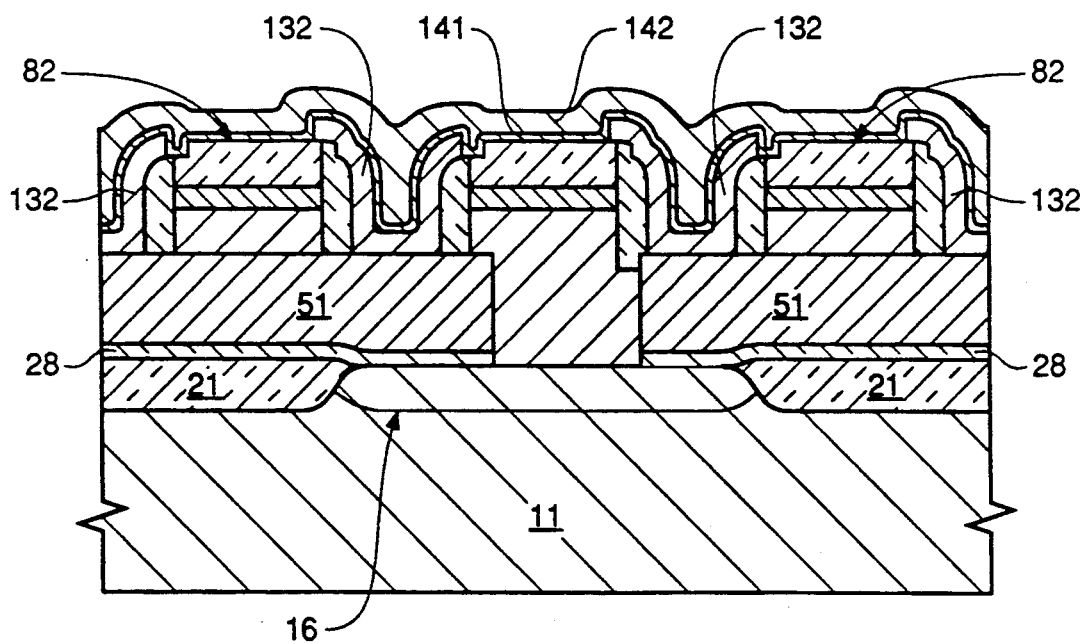
FIG. 14B is a different cross-sectional view of the in-process DRAM array, contemporaneous with FIG. 14A.
Figure 14C:
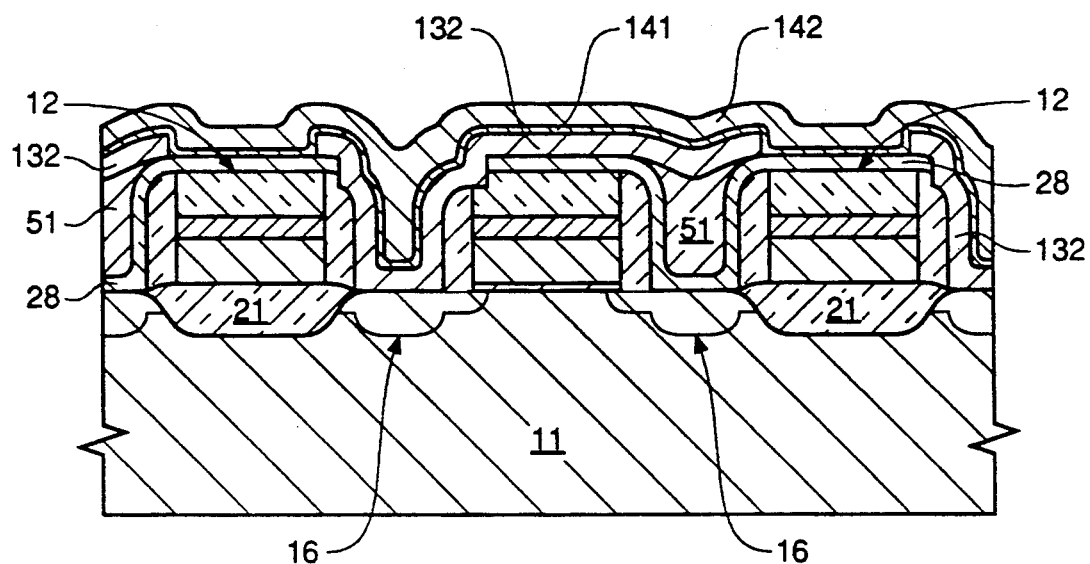
FIG. 14C is a different cross-sectional view of the in-process DRAM array, contemporaneous with FIG. 14A.
Figure 14D:
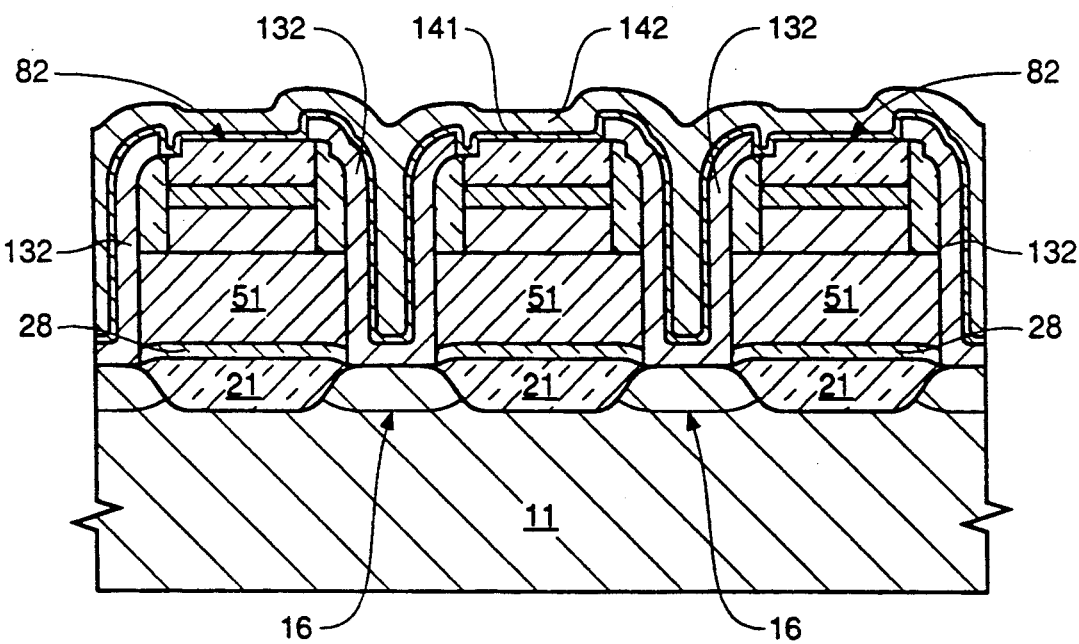
FIG. 14D is a different cross-sectional view of the in-process DRAM array, contemporaneous with FIG. 14A.

Referring now to FIG. 14A, storage-node photomask 131 has been stripped from the in-process array, a silicon nitride cell dielectric layer 141 has been blanket deposited over the array surface, and a polysilicon-4 layer 142, from which the cell plate will be formed has been blanket deposited on top of dielectric layer 141. FIGS. 14B, 14C, and 14D provide contemporaneous perspective os the in-process array.

The array may now be completed using processing techniques that are well known in the art. Although only a single embodiment of the process has been disclosed herein, it will be obvious to those having ordinary skill in the art that changes and modifications may be made to the process without departing from the scope and spirit of the invention as claimed. For example, although silicon nitride is considered a superior to silicon dioxide as a cell dielectric material, the silicon nitride filler strips between the wordlines may replaced by silicon dioxide filler strips. In such a case, silicon nitride would be substituted for all silicon dioxide structures such as wordline and bitline capping dielectric layers, wordline and bitline sidewall spacers, etc.

I claim:

1. A process for manufacturing on a semiconductor wafer an ultra-dense dynamic random access memory array of the stacked-cell type having a series of parallel wordlines patterned from a sandwich of silicon dioxide covered, silicided first polysilicon layer, said wordlines being overlaid by an intersecting series of parallel bitlines, thus creating a waveform topology, said process commencing with a partially-fabricated array which has reached a stage where field oxide regions, active areas, wordlines and silicon dioxide wordline sidewall spacers have been created, and a silicon dioxide substrate isolation layer has been deposited, said process comprising the following sequence of steps:

a) blanket deposition of a conformal silicon nitride layer which completely fills wordline gaps;
  b) planarization of the wafer to the extent that the dielectric wordline covering is exposed and silicon nitride filler strips are left between wordlines;
  c) masking the array with photoresist so that bitline contact regions between wordlines are exposed;
  d) anisotropically etching the array so that silicon nitride in bitline contact regions is removed;
  e) anisotropically etching the array so as to remove portions of the silicon dioxide substrate isolation layer exposed by removal of silicon nitride in bitline contact regions;
  f) stripping the photoresist applied in step c);
  g) conformal deposition of a second polysilicon layer;
  h) deposition of a silicon dioxide bitline capping layer;
  i) masking the silicon dioxide-covered, second polysilicon layer with photoresist in order to define bitlines;
  j) anisotropically etching the silicon dioxide-covered, second polysilicon layer to create bitlines;
  k) blanket deposition of a conformal silicon dioxide bitline spacer layer;
  l) anisotropically etching the bitline spacer layer to create spacers on bitline sidewalls;
  m) masking the array with photoresist so that storage-node contact regions between wordlines are exposed;
  n) anisotropically etching the array so that silicon nitride in storage-node contact regions is removed;
  o) stripping the photoresist applied to the array in step m);
  p) deposition of a storage-node third polysilicon layer;
  q) masking the third polysilicon layer with photoresist so as to define individual storage-node plates within the array;
  r) etching the third polysilicon layer to create the storage-node plates;
  s) stripping the photoresist applied in step q);
  t) deposition of a cell dielectric layer; and
  u) deposition of a cell plate fourth polysilicon layer.

2. The process of claim 1, wherein step a) is performed using chemical vapor deposition.

3. The process of claim 1, wherein the planarization of step b) is performed mechanically.

4. The process of claim 1, wherein the planarization of step b) is performed by spinning on photoresist and a plasma etch back.

5. A process for manufacturing on a semiconductor wafer an ultra-dense dynamic random access memory array of the stacked-cell type having a series of parallel wordlines patterned from a sandwich of first dielectric material covered, silicided first polysilicon layer, said wordlines being overlaid by an intersecting series of parallel bitlines, thus creating a waveform topology, said process commencing with a partially-fabricated array which has reached a stage where field oxide regions, active areas, wordlines and first dielectric material wordline sidewall spacers have been created, and a first dielectric material substrate isolation layer has been deposited, said process comprising the following sequence of steps:

a) blanket deposition of a conformal second dielectric material layer which completely fills wordline gaps, said second dielectric material being selectively etchable with respect to said first dielectric material;

b) planarization of the wafer to the extent that the dielectric wordline covering is exposed and second dielectric material filler strips are left between wordlines;

c) masking the array with photoresist so that bitline contact regions between worklines are exposed;

d) anisotropically etching the array so that second dielectric material in bitline contact regions is removed;

e) anisotropically etching the array so as to remove portions of the first dielectric material substrate isolation layer exposed by removal of the second dielectric material in bitline contact regions;

f) stripping the photoresist applied in step c);

g) conformal deposition of a second polysilicon layer;

h) deposition of a first dielectric material bitline capping layer;

i) masking the first dielectric material covered, second polysilicon layer with photoresist in order to define bitlines;

j) anisotropically etching the first dielectric material covered second polysilicon layer to create bitlines;

k) blanket deposition of a conformal first dielectric material bitline spacer layer;

l) anisotropically etching the bitline spacer layer to create spacers on bitline sidewalls;

m) masking the array with photoresist so that storage-node contact regions between wordlines are exposed;

n) anisotropically etching the array so that second dielectric material in storage-node contact regions is removed;

o) stripping the photoresist applied to the array in step m);

p) deposition of a storage-node third polysilicon layer;

q) masking the third polysilicon layer with photoresist so as to define individual storage-node plates within the array;

r) etching the third polysilicon layer to create the storage-node plates;

s) stripping the photoresist applied in step q);

t) deposition of a cell dielectric layer; and u) deposition of a cell plate fourth polysilicon layer.

6. The process of claim 5, wherein step a) is performed using chemical vapor deposition.

7. The process of claim 5, wherein the planarization of step b) is performed mechanically.

8. The process of claim 5, wherein the planarization of step b) is performed by spinning on photoresist and a plasma etch back.

9. The process of claim 5, wherein said first dielectric material is silicon dioxide, and said second dielectric material is silicon nitride.

10. The process of claim 5, wherein said first dielectric material is silicon nitride, and said second dielectric material is silicon dioxide.

* * * * *